United States Patent
Tatsumi

(10) Patent No.: US 12,341,475 B2
(45) Date of Patent: Jun. 24, 2025

(54) SEMICONDUCTOR DEVICE

(71) Applicant: SUMITOMO ELECTRIC INDUSTRIES, LTD., Osaka (JP)

(72) Inventor: Taizo Tatsumi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 641 days.

(21) Appl. No.: 17/655,061

(22) Filed: Mar. 16, 2022

(65) Prior Publication Data
US 2022/0337197 A1 Oct. 20, 2022

(30) Foreign Application Priority Data

Apr. 16, 2021 (JP) ................. 2021-069880

(51) Int. Cl.
*H03F 1/26* (2006.01)
*H03F 1/56* (2006.01)
*H03F 3/195* (2006.01)
*H03F 3/24* (2006.01)

(52) U.S. Cl.
CPC ............... *H03F 1/26* (2013.01); *H03F 1/56* (2013.01); *H03F 3/195* (2013.01); *H03F 3/245* (2013.01); *H03F 2200/294* (2013.01); *H03F 2200/451* (2013.01)

(58) Field of Classification Search
CPC ... H03F 1/26; H03F 1/56; H03F 3/195; H03F 3/245; H03F 2200/294; H03F 2200/451; H03F 1/086; H03F 2200/129; H03F 2200/135; H03F 2200/153; H03F 2200/222; H03F 2200/318; H03F 2200/387; H03F 1/342; H03F 3/193; H03F 1/0261
USPC ........................................................ 330/285
See application file for complete search history.

(56) References Cited

U.S. PATENT DOCUMENTS

| 10,158,327 B2 | 12/2018 | Kim | |
| 2016/0094184 A1* | 3/2016 | Ripley | H03F 1/0222 330/296 |

* cited by examiner

*Primary Examiner* — Andrea Lindgren Baltzell
*Assistant Examiner* — Jose E Pinero
(74) *Attorney, Agent, or Firm* — IPUSA, PLLC

(57) ABSTRACT

A semiconductor device includes input and output terminals, first and second power supply terminals, first and second transistors, and a first resistance element. In the first transistor, gate and source terminals are respectively connected to the input terminal and the first power supply terminal, a drain terminal is connected to the second power supply terminal in direct current and to the output terminal, and the gate and drain terminals are connected via the first resistance element. In the second transistor, a source terminal is connected to the first power supply terminal, and gate and drain terminals are short-circuited at a node connected to the gate terminal of the first transistor in direct current. In a lower frequency region, an impedance of the first resistance element is lower than impedances of parasitic capacitances in the first transistor between the gate and drain terminals and between the gate and source terminals.

4 Claims, 13 Drawing Sheets

SEMICONDUCTOR DEVICE

CROSS-REFERENCE TO RELATED APPLICATIONS

This application claims priority based on Japanese Patent Application No. 2021-069880 filed on Apr. 16, 2021, and the entire contents of the Japanese patent application are incorporated herein by reference.

BACKGROUND

1. Field of the Invention

The present disclosure relates to a semiconductor device

2. Description of the Related Art

A semiconductor device including an amplifier circuit such as a low noise amplifier (LNA) that amplifies a radio-frequency signal input from an antenna terminal or the like is widely used.

Patent Document 1 discloses a configuration in which a current mirror circuit is used in an amplifier circuit for wireless communication to supply an appropriate bias signal to the amplifier circuit.

The LNA is an amplifier circuit that amplifies an input signal and outputs the amplified signal as an output signal to a circuit in a subsequent stage. Here, as important characteristics of the LNA, there are a noise figure (NF) characteristic indicating a ratio of a signal to noise ratio (SNR) of an input signal to an SNR of an output signal, and a K value (K factor) indicating a margin for oscillation. In order to satisfy a desired NF characteristic, it is necessary to supply an appropriate bias current to the LNA. However, since the bias current is affected by temperature variations, manufacturing variations, and the like, the bias current is controlled using an external terminal in a conventional semiconductor device.

A value of the NF characteristic indicates that a lower noise component is included in the output signal as the value of the NF characteristic decreases, which is preferable as a characteristic of the circuit. In addition, a value of the K value indicates that the circuit operation is more unstable and there is a higher possibility that the circuit oscillates as the value of the K value decreases, and a value of the K value indicates that the circuit operation is more stable as the value of the K value increases, which is preferable as the characteristics of the circuit. In general, it is considered that a value of the K value that exceeds 1.0 indicates that oscillation does not occur regardless of the matching circuit.

RELATED ART DOCUMENTS

Patent Document

[Patent Document 1] U.S. Pat. No. 10,158,327

SUMMARY

A semiconductor device includes an input terminal to which a radio-frequency signal is to be input, an output terminal from which a signal obtained by amplifying the radio-frequency signal is to be output, a first power supply terminal, a first transistor having a gate terminal, a source terminal, and a drain terminal, a second transistor having a gate terminal, a source terminal, and a drain terminal, a second power supply terminal, and a first resistance element. The gate terminal of the first transistor is connected to the input terminal, the source terminal of the first transistor is connected to the first power supply terminal, the drain terminal of the first transistor is connected to the second power supply terminal in tams of direct current, the drain terminal of the first transistor is further connected to the output terminal, the gate terminal of the first transistor and the drain terminal of the first transistor are connected to each other via the first resistance element, the source terminal of the second transistor is connected to the first power supply terminal, the gate terminal of the second transistor and the drain terminal of the second transistor are short-circuited at a first node, the first node being connected to the gate terminal of the first transistor in terms of direct current, and in a low-frequency region lower than a frequency band of the radio-frequency signal, an impedance of the first resistance element is lower than an impedance of a parasitic capacitance between the gate terminal of the first transistor and the drain terminal of the first transistor and is lower than an impedance of a parasitic capacitance between the gate terminal of the first transistor and the source terminal of the first transistor.

BRIEF DESCRIPTION OF THE DIAGRAMS

DETAILED DESCRIPTION

Figure 1:
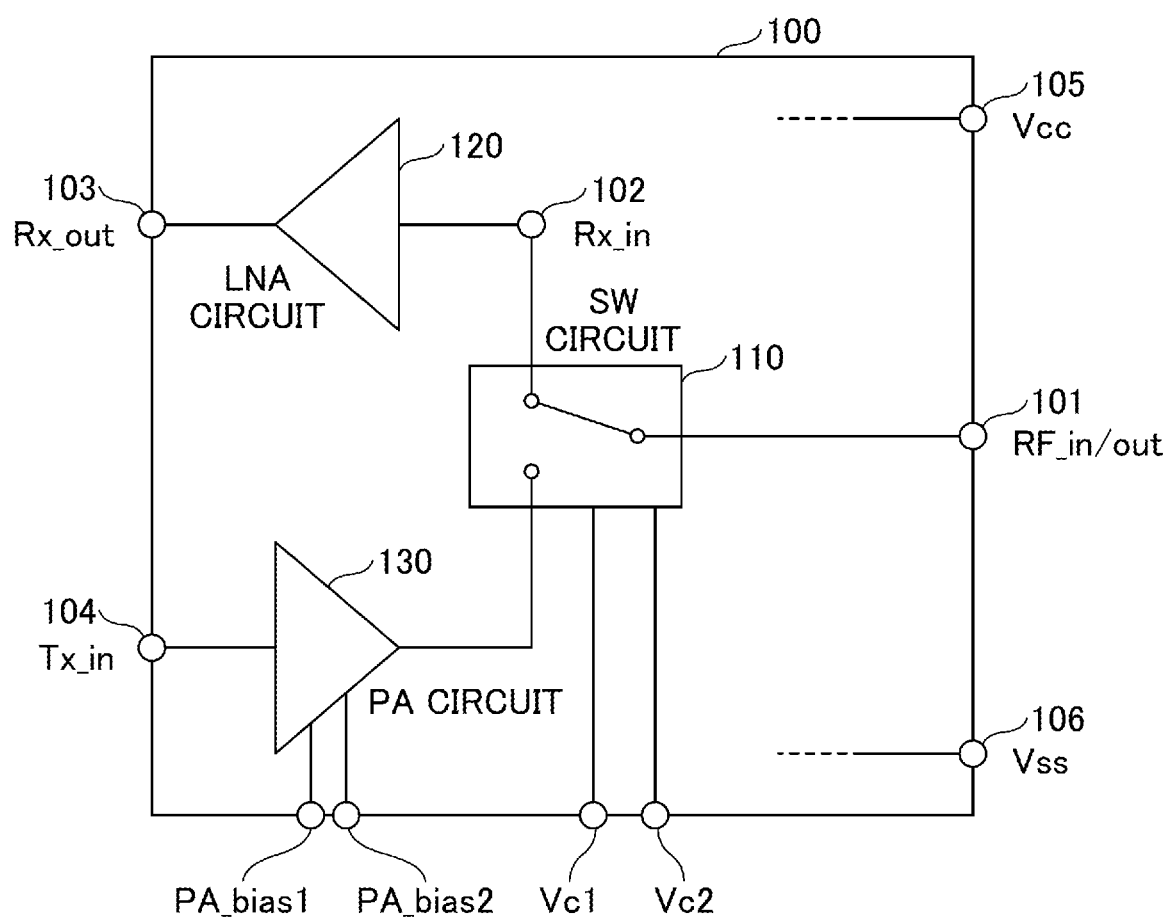
FIG. 1 is a block diagram illustrating an example of a semiconductor device according to an embodiment.

The external terminal in the conventional semiconductor device is an obstacle to reducing the mounting area. In view of the above, it is desirable to provide a stable NF characteristic in a semiconductor device that includes an amplifier circuit that amplifies a radio-frequency signal, without using the external terminal.

According to at least one embodiment of the disclosure, a stable NF characteristic in a semiconductor device that includes an amplifier circuit that amplifies a radio-frequency signal can be provided without using the external terminal.

First, an overview of embodiments of the present disclosure will be described.

The embodiments of the present disclosure will be described below.

Overview of Embodiments of the Present Disclosure (1) A semiconductor device according to the embodiment of the present disclosure includes an input terminal to which a radio-frequency signal is to be input, an output terminal from which a signal obtained by amplifying the radio-frequency signal is to be output, a first power supply terminal, a first transistor having a gate terminal, a source terminal, and a drain terminal, a second transistor having a gate terminal, a source terminal, and a drain terminal, a second power supply terminal, and a first resistance element. The gate terminal of the first transistor is connected to the input terminal, the source terminal of the first transistor is connected to the first power supply terminal, the drain terminal of the first transistor is connected to the second power supply terminal in tarns of direct current, the drain terminal of the first transistor is further connected to the output terminal, the gate terminal of the first transistor and the drain terminal of the first transistor are connected to each other via the first resistance element, the source terminal of the second transistor is connected to the first power supply terminal, the gate terminal of the second transistor and the drain terminal of the second transistor are short-circuited at a first node, the first node being connected to the gate terminal of the first transistor in terms of direct current, and in a low-frequency region lower than a frequency band of the radio-frequency signal, an impedance of the first resistance element is lower than an impedance of a parasitic capacitance between the gate terminal of the first transistor and the drain terminal of the first transistor and is lower than an impedance of a parasitic capacitance between the gate terminal of the first transistor and the source terminal of the first transistor.

With the above configuration, in the semiconductor device including an amplifier circuit that amplifies the radio-frequency signal, a stable NF characteristic can be obtained without using an external terminal. For example, according to the semiconductor device of the present disclosure, a second current flowing through the first transistor can be determined, without depending on an external terminal, by a ratio of the gate width of the first transistor to the gate width of the second transistor and a resistance value of the first resistor. Further, in the semiconductor device according to the present embodiment, for example, even when a threshold voltage Vth of the transistor fluctuates due to manufacturing variations or the like, the fluctuation of the current value of the second current can be suppressed, and thus a stable NF characteristic can be obtained. Furthermore, in the semiconductor device according to the present embodiment, because negative feedback is applied by the first resistance element, stability (K value) with respect to oscillation of the amplifier circuit can be improved.

(2) In the frequency band of the radio-frequency signal, the impedance of the first resistance element is lower than the impedance of the parasitic capacitance between the gate terminal of the first transistor and the drain terminal of the first transistor.

(3) Preferably, the semiconductor device further includes a second resistance element connected between the source terminal of the second transistor and the first power supply terminal.

In the semiconductor device, for example, a ratio of the gate width of the first transistor to the gate width of the second transistor may be less than a ratio of the second current to the first current due to a limitation of a minimum layout of an FET or the like. In such a case, the semiconductor device can maintain a function of a current mirror circuit by using the resistance value of the second resistance element.

(4) Preferably, the first transistor and the second transistor are formed on a semiconductor substrate. Such a semiconductor device can be reduced in a mounting area by being configured by a monolithic microwave integrated circuit (MMIC) of which circuits are formed on the same semiconductor substrate.

Details of Embodiments of the Present Disclosure

The embodiments of the semiconductor device according to the present disclosure will be described below with reference to the drawings. In the following description, the same elements or corresponding elements are denoted by the same reference numerals, and description thereof may be omitted.

Configuration of Conventional Semiconductor Device

Before describing a configuration of a semiconductor device 100 according to the present disclosure, an overview of a configuration of a conventional semiconductor device will be described.

Figure 15:
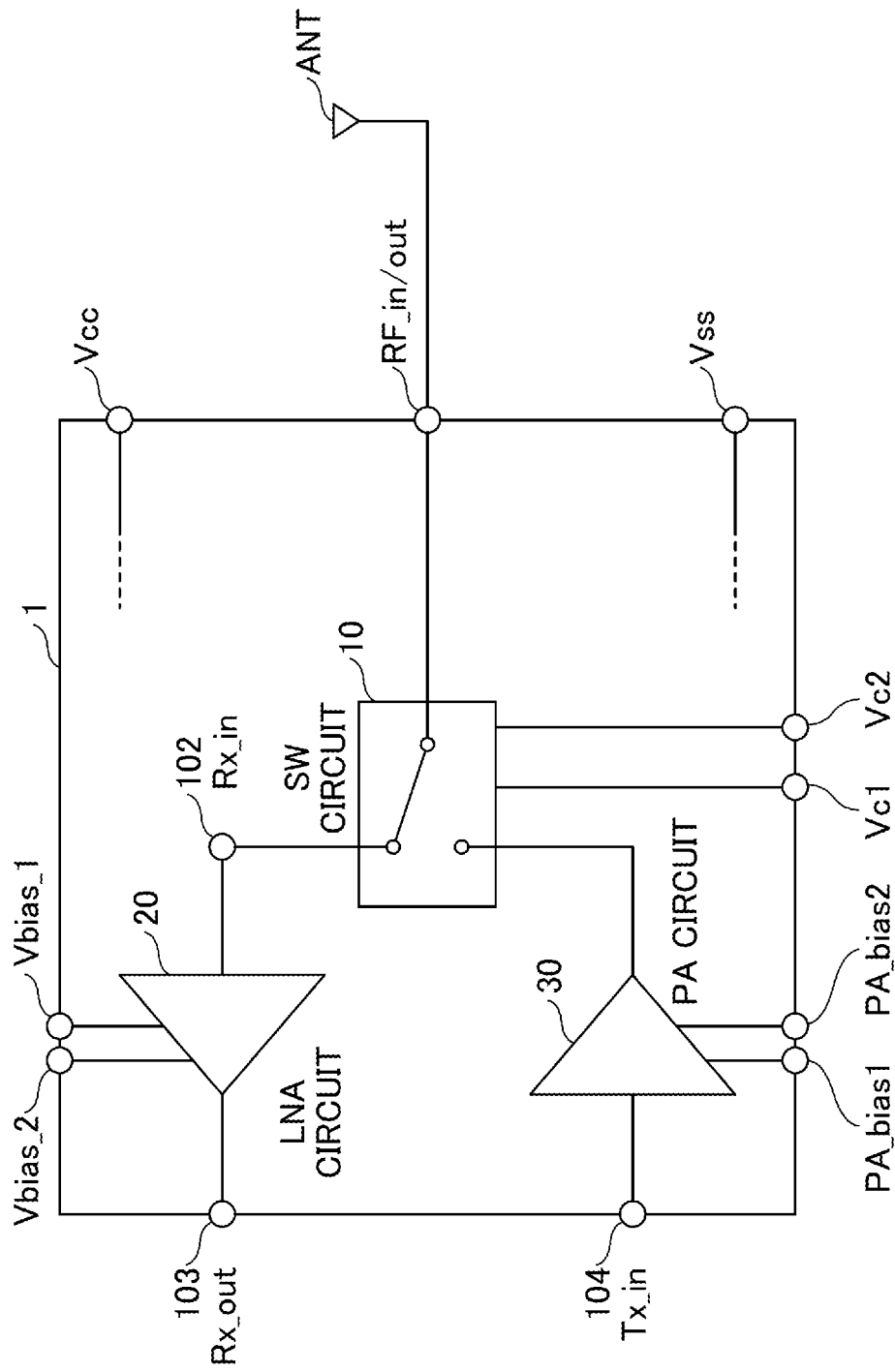
FIG. 15 is a block diagram illustrating an example of a conventional semiconductor device.

FIG. 15 is a block diagram illustrating an example of the conventional semiconductor device. A semiconductor device 1 is used as a front-end circuit in a wireless communication device, and includes, for example, a switch (SW) circuit 10, a low noise amplifier (LNA) circuit 20, and a power amplifier (PA) circuit 30.

SW circuit 10 is a switch that selectively connects an RF in/out terminal of semiconductor device 1 to LNA circuit 20 or PA circuit 30 in accordance with a voltage level of control voltage Vc1 and a voltage level of control voltage Vc2 output from a controller or the like of the wireless communication device.

LNA circuit 20 is an amplifier circuit that amplifies a reception signal input to an Rx in terminal 102, which is an input terminal, and outputs the amplified reception signal from an Rx_out terminal 103, which is an output terminal, to a circuit in a subsequent stage. In the example of FIG. 15, external terminals Vbias_1 and Vbias_2 are provided so that the bias current flowing through LNA circuit 20 can be externally changed.

PA circuit 30 is an amplifier circuit that amplifies a transmission signal input to a Tx_in terminal 104, which is an input terminal, from a circuit in a preceding stage and outputs the amplified transmission signal to SW circuit 10. In the example of FIG. 15, external terminals PA_bias1 and PA_bias2 are provided so that the bias current flowing through PA circuit 30 can be externally adjusted.

A Vcc terminal is connected to SW circuit 10, LNA circuit 20, PA circuit 30, and the like, and supplies a power supply voltage to each circuit. A Vss terminal is connected to SW circuit 10, LNA circuit 20, PA circuit 30, and the like, and connects each circuit to a ground potential (circuit ground).

(Configuration of Conventional LNA Circuit)

Figure 16:
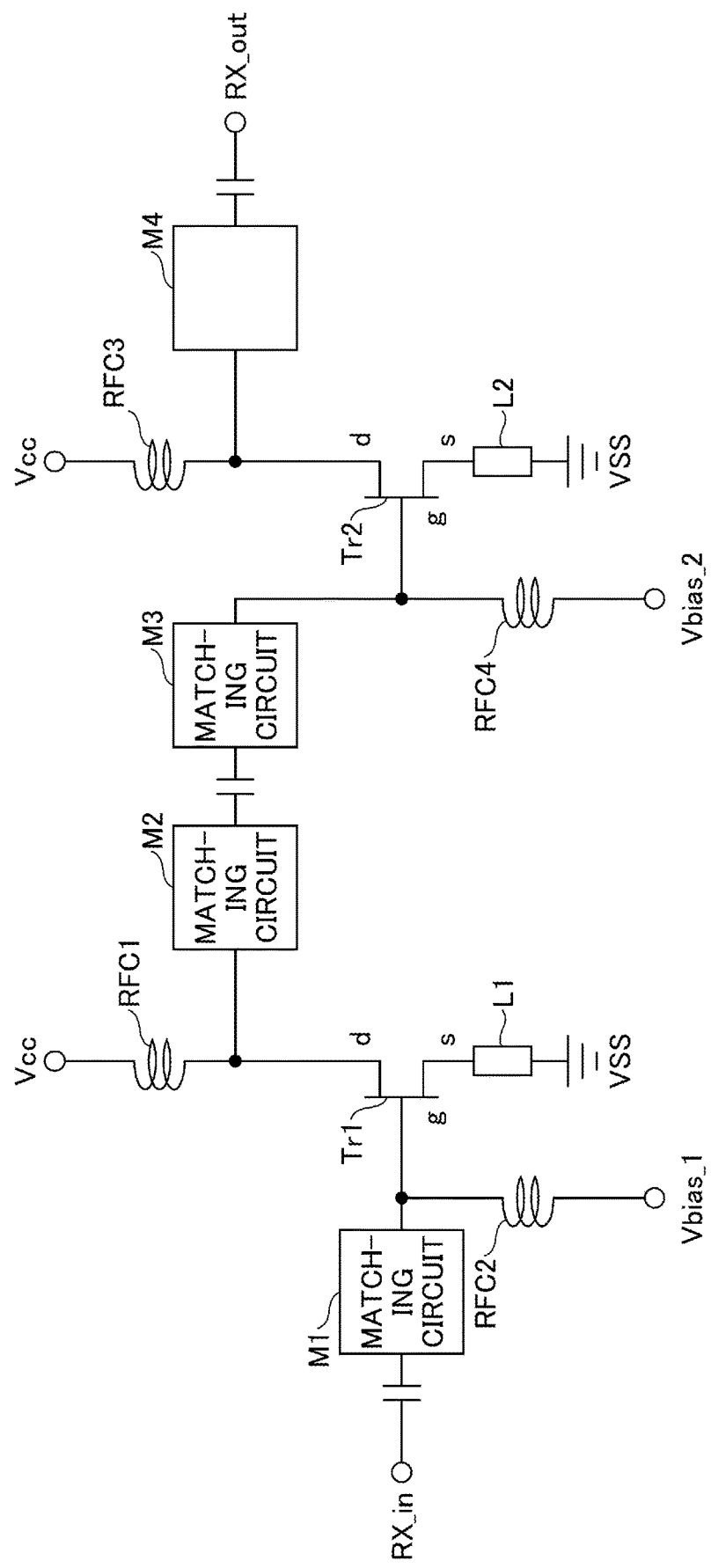
FIG. 16 is a diagram illustrating an example of a circuit configuration of the conventional LNA circuit.

FIG. 16 illustrates an example of a circuit configuration of a conventional LNA circuit. LNA circuit 20 illustrated in FIG. 16 has a two-stage configuration of an amplifier circuit configured by a transistor Tr1 and an amplifier circuit configured by a transistor Tr2.

Transistors Tr1 and Tr2 are field effect transistors (FETs) such as GaAs (gallium arsenide) FETs or GaN (gallium nitride) FETs. Source terminals of transistors Tr1 and Tr2 are connected to the Vss terminal, which is a power supply terminal of a ground potential, via inductor elements L1 and L2, respectively. Further, drain terminals of transistors Tr1 and Tr2 are connected to the Vcc terminal, which is a power supply terminal for applying a drain voltage, via choke coils RFC1 and RFC3 for high frequency, respectively. Further, the gate terminals of transistors Tr1 and Tr2 are connected to external terminals Vbias_1 and Vbias_2, which are external terminals for applying a gate voltage, via choke coils RFC2 and RFC4 for high frequency, respectively.

Matching circuits M1 to M4 are matching circuits that match input impedance or output impedance of each amplifier circuit, and are configured by passive elements such as delay lines and inductor elements, for example. With the above configuration, each of transistors Tr1 and Tr2 constitutes a source-grounded FET amplifier that amplifies input power input to the gate terminal and outputs the amplified input power from the drain terminal.

In LNA circuit 20 illustrated in FIG. 16, gate bias voltages of transistors Tr1 and Tr2 are applied from the outside by using the external terminals Vbias_1 and Vbias_2. However, to reduce the mounting area, it is desirable to control the bias current of transistors Tr1 and Tr2 by, for example, a self-bias function in MMIC without using an external terminal. However, in the related art, it is difficult to obtain stable NF characteristic with respect to temperature variations and manufacturing variations by a self-bias function in the MMIC without using an external terminal.

In view of this, the present disclosure discloses an LNA circuit in which a stable NF characteristic is obtained by a self-bias function in an MMIC without using an external terminal and a semiconductor device including the LNA circuit.

Configuration of Semiconductor Device

FIG. 1 is a block diagram illustrating an example of a semiconductor device according to an embodiment. Semiconductor device 100 according to the embodiment of the present disclosure is, for example, an MMIC used as a front-end circuit in a wireless communication device of a microwave-band (6 GHz to 90 GHz) or the like. Semiconductor device 100 includes, for example, an SW circuit 110, an LNA circuit 120, a PA circuit 130 and the like. However, the configuration of semiconductor device 100 illustrated in FIG. 1 is an example. For example, semiconductor device 100 may include SW circuit 110 and LNA circuit 120, or may include only LNA circuit 120.

SW circuit 110 selectively connects an RF in/out terminal 101 of semiconductor device 100 to LNA circuit 120 or PA circuit 130 in accordance with the logic of control voltage Vc1 and Vc2 output from a controller or the like of the wireless communication device. In the example of FIG. 1, SW circuit 110 connects RF in/out terminal 101 to Rx in terminal 102 of LNA circuit 120. In this case, RF in/out terminal 101 functions as an input terminal for inputting a reception signal.

LNA circuit 120 is an amplifier circuit that amplifies the reception signal input to Rx in terminal 102 of LNA circuit 120 and outputs the amplified reception signal from Rx_out terminal (output terminal) 103 to a circuit in a subsequent stage. As illustrated in FIG. 1, semiconductor device 100 according to the embodiment of the present disclosure does not include external terminals Vbias_1 and Vbias_2 provided in the conventional semiconductor device 1 described with reference to FIG. 15.

PA circuit 130 is an amplifier circuit that amplifies a transmission signal input from a circuit in a previous stage to Tx_in terminal 104 and outputs the amplified transmission signal to SW circuit 110. It is known that electrical characteristics, such as the maximum power that can be output by PA circuit 130 and distortion, change depending on a bias current flowing through PA circuit 130. Also in semiconductor device 100 according to the embodiment of the present disclosure, as illustrated in FIG. 1, external terminals PA_bias1 and PA_bias2 are provided so that the bias current flowing through PA circuit 130 can be externally adjusted.

A Vcc terminal 105 is a second power supply terminal that is connected to SW circuit 10, LNA circuit 20, PA circuit 30, and the like and that supplies a power supply voltage to each circuit. A Vss terminal 106 is a first power supply terminal that is connected to SW circuit 10, LNA circuit 20, PA circuit 30, and the like and that connects each circuit to a ground potential (circuit ground).

(NF Characteristic of LNA Circuit)

Important characteristics related to LNA circuit 120 include an NF characteristic indicating the amount of noise generated in LNA circuit 120 and a K value (K factor) indicating a margin for oscillation of LNA circuit 20. It is known that the NF characteristic changes depending on a bias current flowing through an FET included in LNA circuit 120.

Figure 2:
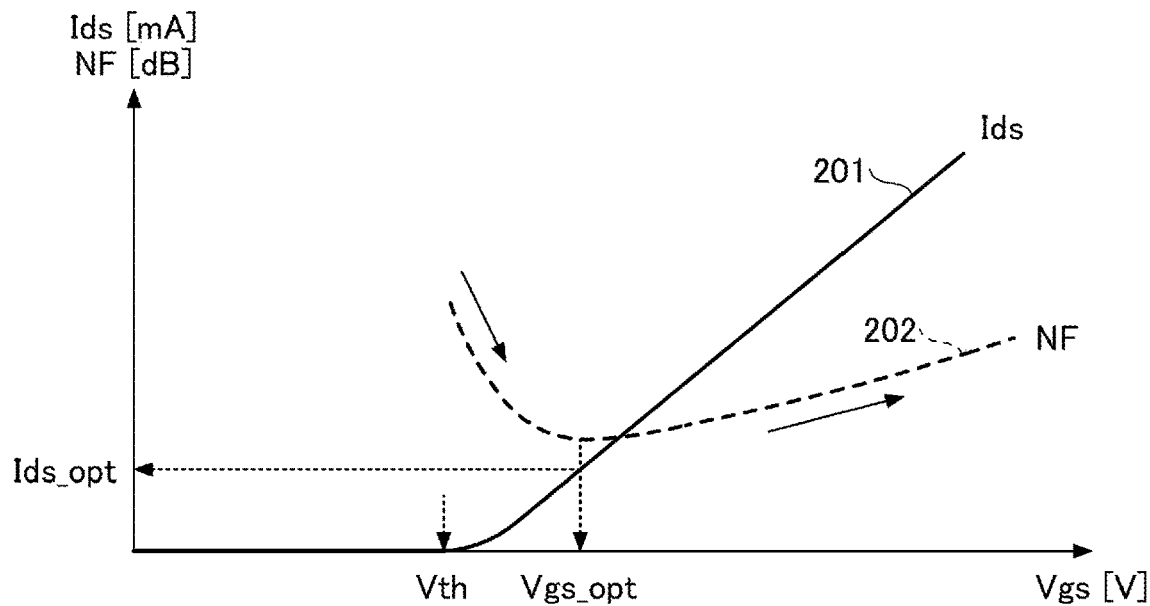
FIG. 2 is a graph for explaining a relationship between an NF characteristic of an FET and Vgs.

FIG. 2 is a graph for explaining a relationship between the NF characteristic of an FET and Vgs. In the graph illustrated in FIG. 2, the horizontal axis represents Vgs that is the source-gate voltage of the FET in the source-grounded FET amplifier. The vertical axis represents a drain current Ids that is the current flowing between the drain and source of the FET, and a value of the NF characteristic. As indicated by a solid line 201 in FIG. 2, the current value of drain current Ids of the FET increases substantially in proportion to the Vgs value when the Vgs value exceeds threshold voltage Vth of the FET. With respect to the above, as indicated by a broken line 202 in FIG. 2, in a range where the Vgs value exceeds threshold voltage Vth, the value of the NF characteristic decreases as the Ids value increases, and from a point where the Vgs value exceeds Vgs_opt, the value of the NF characteristic increases as the Ids value increases. It is conceivable that this is caused because, as a characteristic of a general FET, the high-frequency operation of the FET is improved as the Vgs value increases, but when the Vgs value increases to some extent (=Vgs_opt), the high-frequency operation of the FET is saturated, and thus an increase in noise such as a gate noise coefficient and a drain noise coefficient becomes dominant.

Because the NF characteristic of LNA circuit 120 greatly affects the reception sensitivity of the wireless communication device, it is required to design LNA circuit 120 such that the value of the NF characteristic decreases. Specifically, in FIG. 2, it is important to set the gate voltage of the ELT to Vgs_opt so that the bias current Ids_opt, which minimizes the value of the NF characteristic, can flow. However, threshold voltage Vth of the FET fluctuates due to, for example, manufacturing variations, temperature dependence, and the like.

Figure 3:
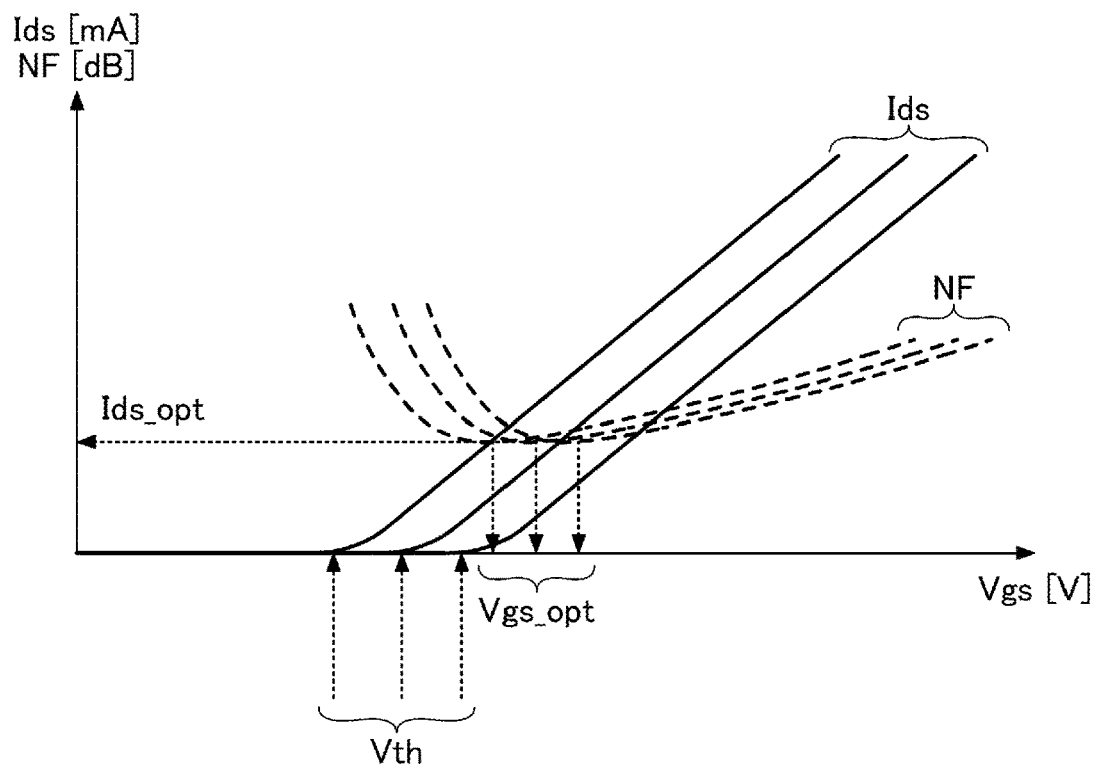
FIG. 3 is a graph for explaining an influence of manufacturing variations of FETs.

FIG. 3 is a graph for explaining the influence of manufacturing variations of the FET. As in FIG. 2, FIG. 3 indicates Vgs on the horizontal axis, and drain current Ids and the NF characteristic on the vertical axis. As illustrated in FIG. 3, when threshold voltage Vth varies due to manufacturing variations of the FET, gate voltage Vgs_opt for setting the drain current of the FET to Ids_opt, which minimizes the value of the NF characteristic, varies. Therefore, if the gate voltage Vgs is simply set to a constant value, the value of the NF characteristic fluctuates as illustrated in FIG. 3 due to variations in threshold voltage Vth of the FET. Therefore, it is desirable that LNA circuit 120 has a function of maintaining the value of drain current Ids at Ids_opt even if threshold voltage Vth of the FET varies.

Patent Document 1 describes an LNA circuit to which a current mirror circuit is applied to suppress variations in drain current Ids due to manufacturing variations of the FET. (LNA Circuit to which Current Mirror Circuit is Applied)

Figure 4:
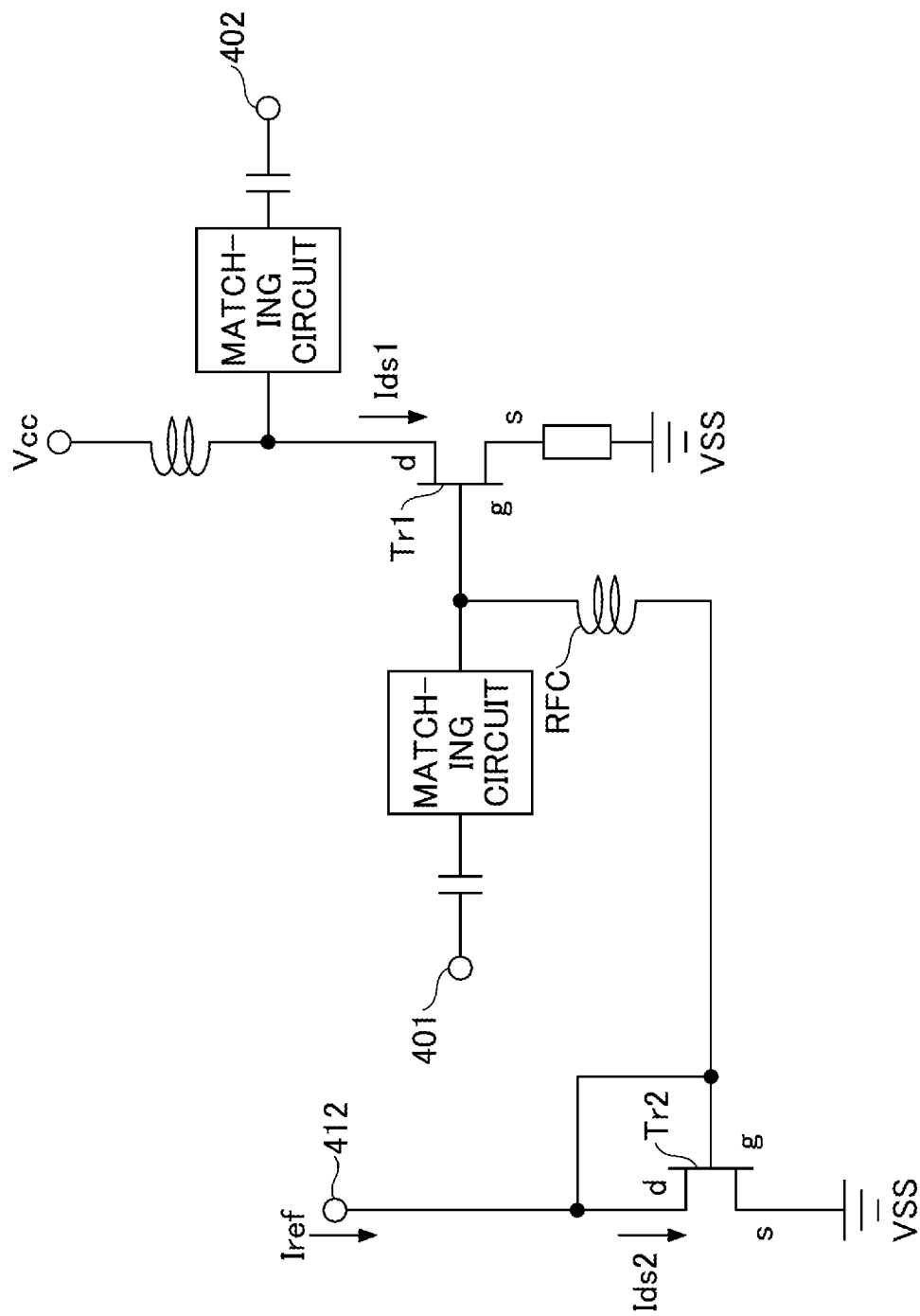
FIG. 4 is a diagram illustrating an example of a circuit configuration of an LNA circuit to which a current mirror circuit is applied.

FIG. 4 is a diagram illustrating an example of a circuit configuration of an LNA circuit to which a current mirror circuit is applied. In an LNA circuit 400 illustrated in FIG. 4, transistor Tr1 constitutes a source-grounded FET amplifier, and amplifies a signal input from an input terminal 401 and outputs the amplified signal from an output terminal 402. Transistor Tr2 is an FET constituting a current mirror circuit together with transistor Tr1, and a gate terminal and a drain terminal are connected in terms of direct current to a gate terminal of transistor Tr1 via a choke coil RFC for high frequency.

In FIG. 4, a drain current Ids2 the same as a reference current Iref input from an Iref terminal 412 flows through transistor Tr2 as indicated in Equation (1).

$$Ids2 = Iref \quad (1)$$

Further, in transistor Tr1, a drain current Ids' proportional to drain current Ids2 of transistor Tr2 flows in accordance with the ratio of the gate width of transistor Tr1 with respect to the gate width of transistor Tr2. This relation is expressed by the following Equation (2), when the gate width of transistor Tr1 is Wg_tr1 and the gate width of transistor Tr2 is Wg_tr2, for example.

$$Wg\_tr1/Wg\_tr2 = Ids1/Ids2 \quad (2)$$

From the above Equations (1) and (2), it is apparent that by supplying reference current Iref to Iref terminal 412, drain current Ids' of transistor Tr1 can be set to Ids_opt that minimizes the value of the NF characteristic satisfying the following Equation (3).

$$Ids\_opt = (Wg\_tr1/Wg\_tr2) \times Iref \quad (3)$$

Note that with respect to (Wg_tr1/Wg_tr2) in Equation (3), it is assumed that the numerator and the denominator increase and decrease in the same direction in accordance with manufacturing variations, and this term is constant regardless of manufacturing variations. Therefore, if the value of reference current Iref can be maintained constant, the value of drain current Ids of transistor Tr1 can be maintained at Ids_opt.

However, in this method, Iref terminal 412 remains as an external terminal in semiconductor device 100. Further, to generate reference current Iref inside semiconductor device 100, the number of internal circuits increases. Therefore, semiconductor device 100 according to the present disclosure includes an LNA circuit as described below to obtain a stable NF characteristic without using an external terminal.

First Embodiment

<Configuration of LNA Circuit>

Figure 5A:
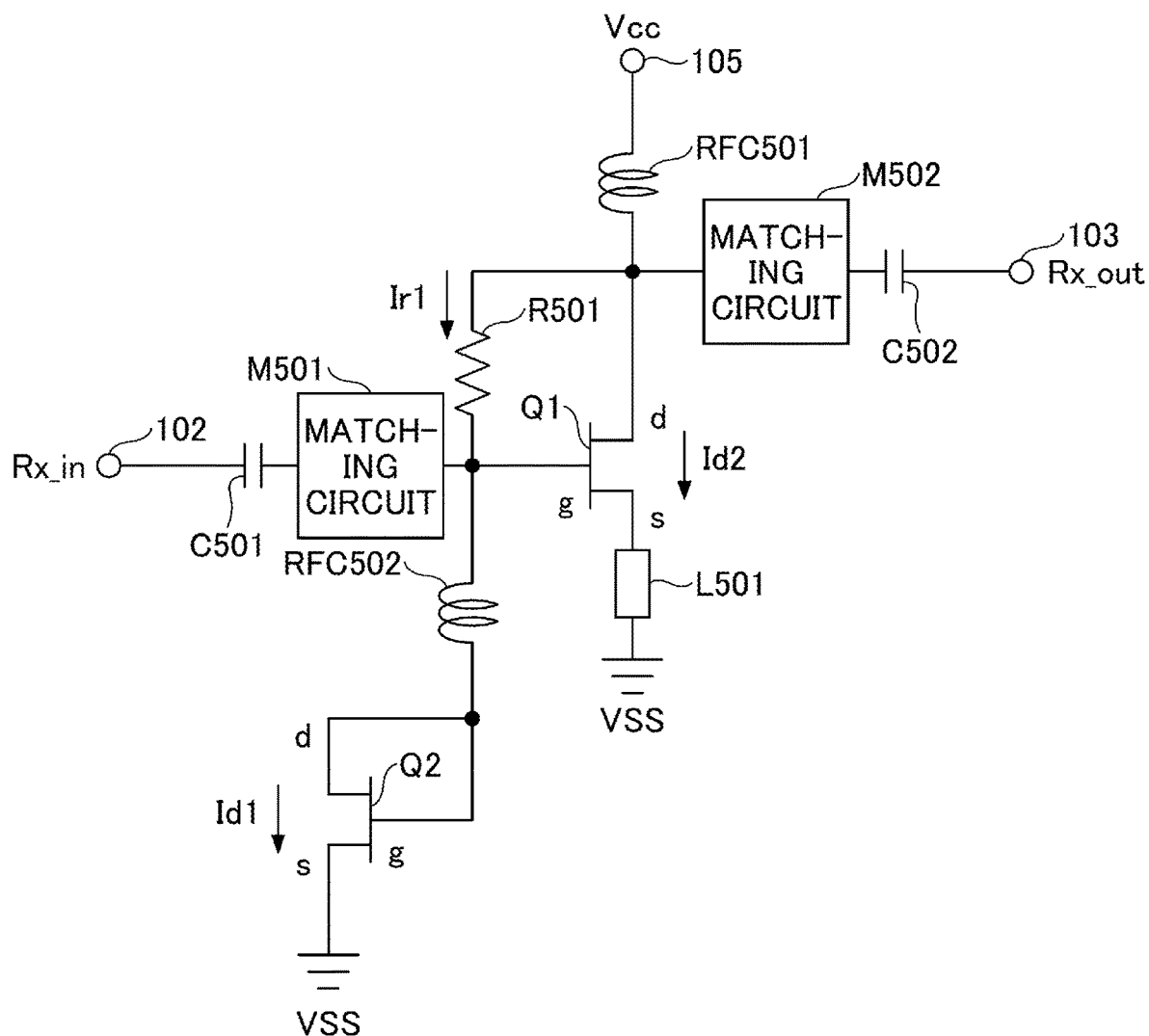
FIG. 5A is a diagram (1) illustrating an example of a circuit configuration of an LNA circuit according to a first embodiment.

FIG. 5A is a diagram (1) illustrating an example of a circuit configuration of an LNA circuit according to a first embodiment. LNA circuit 120 illustrated in FIG. 5A includes a first transistor Q1 constituting a source-grounded FET amplifier and a second transistor Q2 constituting a current mirror circuit with first transistor Q1.

Figure 5B:
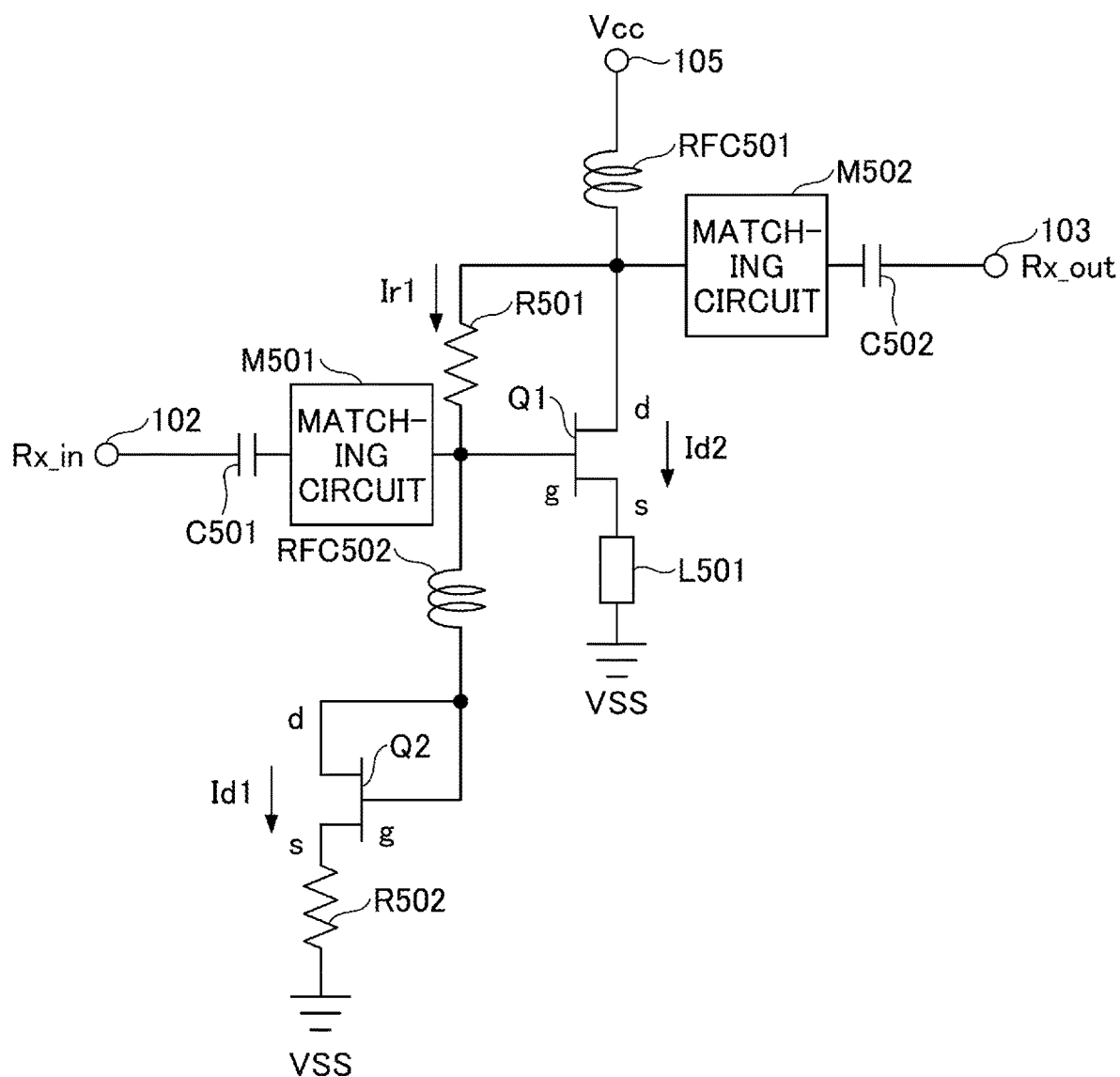
FIG. 5B is a diagram (2) illustrating an example of the circuit configuration of the LNA circuit according to the first embodiment.

First transistor Q1 is, for example, an FET, such as a GaAs FET or a GaN FET, having a gate length of approximately 60 nm to 600 nm and a gate width of approximately 30 µm to 300 µm. However, first transistor Q1 may be an FET having a configuration different from that described above. A gate terminal of first transistor Q1 is connected to an input terminal, for example Rx in terminal 102 or the like. In the example of FIGS. 5A and 5B, the gate terminal of first transistor Q1 is connected to the input terminal such as Rx in terminal 102 or RF in/out terminal 101 via a matching circuit M501 and a capacitance element C501. As described above, in the present disclosure, being connected is not limited to a state of being physically connected, and includes, for example, a state of being electrically connected via another element, circuit, or the like.

A source terminal of first transistor Q1 is connected to a Vss terminal (first power supply terminal) that is a ground potential (circuit ground) via an inductor element L501. A drain terminal of first transistor Q1 is connected to an output terminal such as Rx_out terminal 103 via, for example, a matching circuit M502, a capacitance element C502 and the like. Further, the drain terminal of first transistor Q1 is connected in terms of direct current to a Vcc terminal (second power supply terminal) 105 that supplies a power supply voltage via a choke coil RFC501 for high frequency. Furthermore, the gate terminal and the drain terminal of first transistor Q1 are connected via a first resistance element R501.

Second transistor Q2 is, for example, an FET that is famed on the same semiconductor substrate as that on which first transistor Q1 is formed and that has the same gate length as first transistor Q1, but is not limited thereto. A source terminal of second transistor Q2 is connected to, for example, the Vss terminal (first power supply terminal). A gate terminal and a drain terminal of second transistor Q2 are short-circuited, and are connected in tams of direct current to the gate terminal of first transistor Q1 via a choke coil RFC502 for high frequency.

Capacitance elements C501 and C502 are capacitors for cutting direct current and may be included in, for example, matching circuit M501 or matching circuit M502. Matching circuit M501 is a matching circuit that matches the input impedance of the FET amplifier configured by first transistor Q1 to the impedance of the input terminal, such as Rx in terminal 102, that is estimated from the input terminal to first transistor Q1. Matching circuit M502 is a matching circuit that matches the output impedance of the FET amplifier configured by first transistor Q1 to the impedance of the output terminal, such as Rx_out terminal 103, that is estimated from first transistor Q1 to the output terminal. Matching circuits M501 and M502 are formed of passive elements such as delay lines and inductor elements. Inductor element L501 is a line element or the like for setting the gain of first transistor Q1 in design.

In LNA circuit 120 illustrated in FIG. 5A, a current Ir1 flowing through first resistance element R501 is expressed by the following Equation (4), where Vg is the voltage of the gate terminal of first transistor Q1, Vcc is the voltage of Vcc terminal 105, and R1 is the resistance value of first resistance element R501.

$$Ir1=(Vcc-Vg)/R1 \quad (4)$$

In second transistor Q2, drain current Id1 that is the same as current Ir1 flowing through first resistance element R501 flows, as illustrated in Equation (5).

$$Id1=Ir1 \quad (5)$$

In first transistor Q1, a drain current Id2 proportional to drain current Id1 of second transistor Q2 flows in accordance with the ratio of the gate width of first transistor Q1 to the gate width of second transistor Q2. This relationship is expressed by the following Equation (6) when the gate width of first transistor Q1 is Wg_Q1 and the gate width of second transistor Q2 is Wg_Q2, for example.

$$Wg\_Q1/Wg\_Q2=Id2/Id1 \quad (6)$$

It is apparent from the above Equations (5) and (6) that current Ir1 satisfying the following Equation (7) can set drain current Id2 of first transistor Q1 to Ids_opt.

$$Ids\_opt=(Wg\_Q1/Wg\_Q2) \times Ir1 \quad (7)$$

Further, from Equations (4) and (7), by setting a resistance value R1 of the first resistance element so that current Ir1 flows through first resistance element R501, the following Equation (8) is obtained.

$$Ids\_opt=(Wg\_Q1/Wg\_Q2) \times (Vcc-Vg)/R1 \quad (8)$$

From Equation (4), a value of current Ir1 flowing through first resistance element R501 is influenced by manufacturing variation of first resistance element R501. However, because the manufacturing variation is as small as ±5% by using a thin-film metal resistance element, the influence on the current Ir1 is small. In addition, although a value of the current Ir1 is influenced by the manufacturing variation of first transistor Q1, the influence of the variation of threshold voltage Vth on a value of (Vcc−Vg) is as small as ±4% when Vcc=4 V and Vg=±0.15 V, and thus the influence on current Ir1 is small.

As expressed in Equation (8), according to LNA circuit 120 according to the first embodiment, the value of drain current Id2 of first transistor Q1 can be changed by the resistance value R1 of first resistance element R501. Therefore, by designing first resistance element R501 so as to have a resistance value at which the NF characteristic of the amplifier circuit configured by first transistor Q1 minimizes Ids_opt (or a predetermined value or less), an NF characteristic suitable for an LNA circuit can be achieved. In addition, according to LNA circuit 120 of the first embodiment, for example, external terminals such as Iref terminal 412 of FIG. 4 or Vbias_1 and Vbias_2 of FIG. 16 are not necessary, and thus the size of semiconductor device 100 can be reduced.

In the low-power-consumption semiconductor device 100, when the gate width of first transistor Q1 is Wg1 and the gate width of second transistor Q2 is Wg2, for example, Wg1 that is the gate width of first transistor Q1 may be set to a value close to the minimum rule. In such a case, Equation (7) may have a relationship as illustrated in Equation (9) due to the restriction of the minimum layout rule of the FET.

$$Ids\_opt>(Wg\_Q1/Wg\_Q2) \times Ir1 \quad (9)$$

In such a case, for example, as illustrated in FIG. 5B, by adding a second resistance element R502, the function of first transistor Q1 and second transistor Q2 is maintained as a current mirror circuit.

FIG. 5B is a diagram illustrating an example of a circuit configuration of the LNA circuit according to the first embodiment. The LNA circuit illustrated in FIG. 5B includes second resistance element R502 between the source terminal and the VSS terminal of second transistor Q2 in addition to the configuration of LNA circuit 120 described in FIG. 5A. By this second resistance element R502, the value of the total source resistance value Rs=(intrinsic Rs+parasitic Rs) of the FET is adjusted so as to satisfy Equation (10). This can more stably maintain the function of first transistor Q1 and second transistor Q2 as a current mirror circuit.

$$(R2+Rs\_Q2)/(Rs\_Q1)=Id2/Id1 \quad (10)$$

Here, R2 denotes a resistance value of second resistance element 502, Rs_Q2 denotes a value of a source resistance inherent in second transistor Q2, and Rs_Q1 denotes a value of a source resistance inherent in first transistor Q1.

As described above, according to LNA circuit 120 according to the first embodiment and semiconductor device 100 including LNA circuit 120, drain current Ids of LNA circuit 120 can be stably set to Ids_opt, which minimizes the value of the NF characteristic, without using an external terminal.

Further, in LNA circuit 120 according to the first embodiment and semiconductor device 100 including LNA circuit 120, because first resistance element R501 serves as a negative feedback resistance, an effect of improving the K value indicating the margin of oscillation can be obtained.

(Effect of Improving K Value)

Here, the effect of improving the K value, in LNA circuit 120 according to the first embodiment as illustrated in FIGS. 5A and 5B, by first resistance element R501 functioning as a feedback resistor, will be described.

Figure 6:
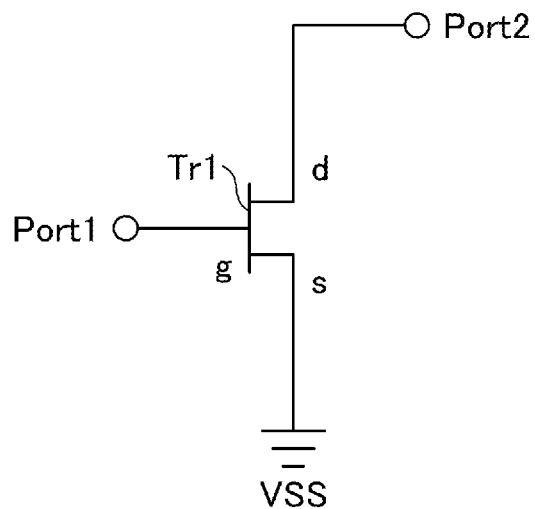
FIG. 6 is a diagram illustrating an example of a circuit of an FET amplifier to which a resistance element is not added.

FIG. 6 is a diagram illustrating an example of a circuit of an FET amplifier 600 to which no resistance element is added. In FET amplifier 600 illustrated in FIG. 6, the source terminal of the FET is grounded to the VSS terminal that is a ground potential, and only elements related to input/output signals are illustrated in the source-grounded FET amplifier that amplifies a signal input from the Port1 and outputs the amplified signal from the Port2.

Figure 7:
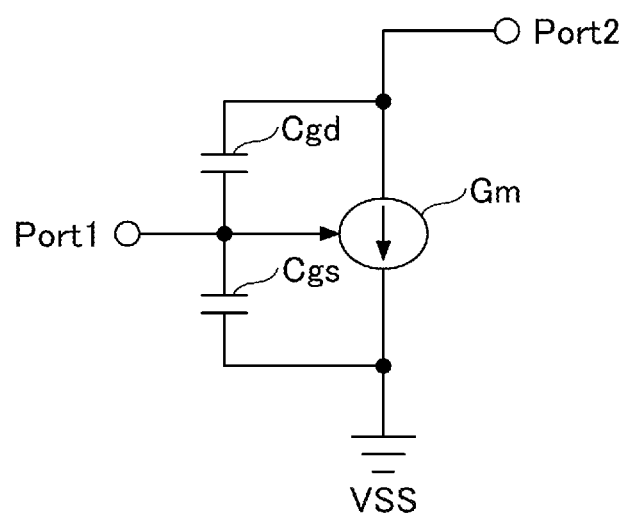
FIG. 7 is a diagram illustrating an equivalent circuit of the FET amplifier to which the resistance element is not added.

FIG. 7 is a diagram illustrating an equivalent circuit of FET amplifier 600 to which no resistance element is added. The equivalent circuit of FET amplifier 600 illustrated in FIG. 6 can be represented by parasitic capacitance Cgd between a gate terminal and a drain terminal of transistor Tr1, parasitic capacitance Cgs between the gate terminal and a source terminal of transistor Tr1, and a current source having a transconductance Gm, as illustrated in FIG. 7.

Figure 8:
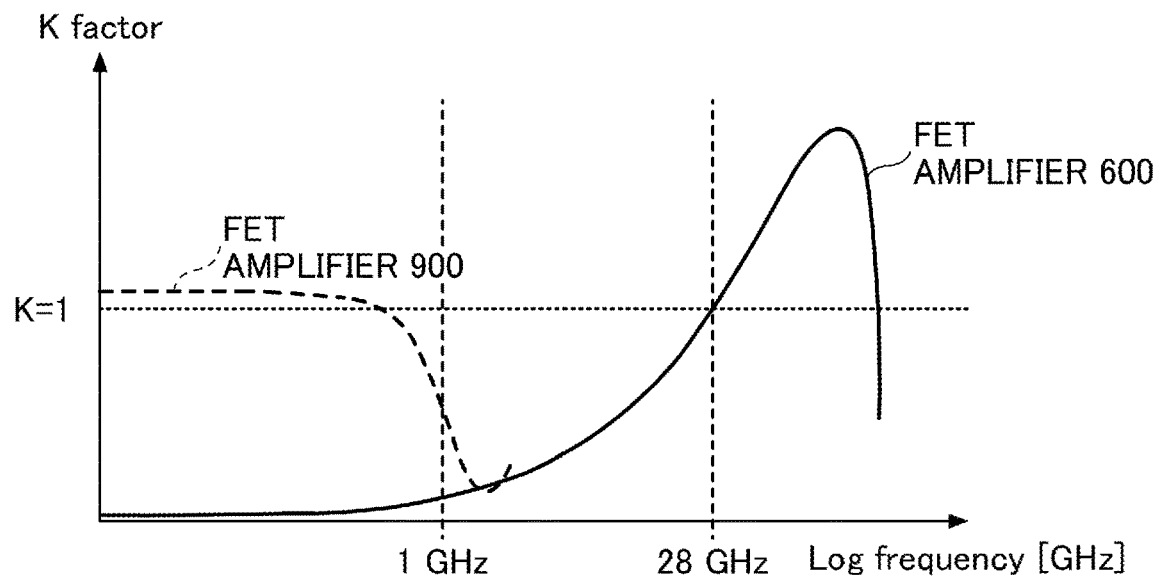
FIG. 8 is a graph illustrating an example of a frequency characteristic of a K value of the ELT amplifier.

FIG. 8 is a graph indicating an example of frequency characteristics of the K values of the FET amplifiers. In the graph illustrated in FIG. 8, the horizontal axis represents frequency, and the vertical axis represents K value that is an index of stability of the FET amplifier. The K value is calculated by the following Equation (11).

[Formula 1]

$$K = \frac{1 + |S_{11}S_{22} - S_{12}S_{21}|^2 - |S_{11}|^2 - |S_{22}|^2}{2|S_{12}S_{21}|} \quad (11)$$

Here, $S_{11}$ denotes a reflection coefficient measured from Port1, $S_{22}$ denotes a reflection coefficient measured from Port2, $S_{21}$ denotes a forward power gain from Port1 to Port2, and $S_{12}$ denotes a reverse power gain from Port2 to Port1.

As described above, the K value indicates that as the K value decreases, the possibility of unstable oscillation increases, and as the K value increases, the oscillation becomes more stable. When the K value exceeds 1.0, oscillation does not occur regardless of the matching circuit.

In FIG. 8, the solid line graph indicates the frequency characteristic of the K value of FET amplifier 600 to which no resistance element is added, as illustrated in FIGS. 6 and 7. For example, in FIG. 7, when feedback from Port2 to Port1 is caused by parasitic capacitance Cgd, the impedance of parasitic capacitance Cgd becomes high in the low-frequency region, and positive feedback, in which the potential between Port2 and Port1 increases, is caused, so that the K value decreases as the frequencies become lower, and the ELT amplifier 600 becomes unstable.

Figure 9:
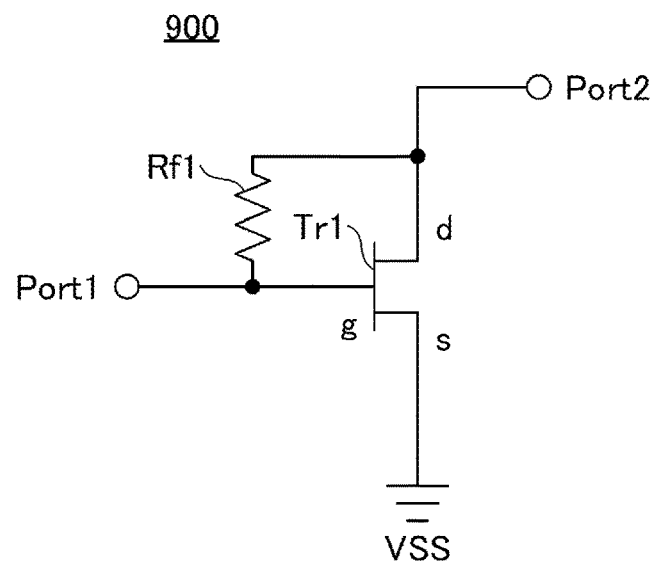
FIG. 9 is a diagram illustrating an example of a circuit of an FET amplifier to which a resistance element is added.

FIG. 9 is a diagram illustrating an example of a circuit of an FET amplifier 900 to which a resistance element is added. FET amplifier 900 illustrated in FIG. 9 has a configuration in which a resistance element Rf1 is connected between the gate terminal and the drain terminal of the transistor Tr1 of FET amplifier 600 illustrated in FIG. 6.

Figure 10:
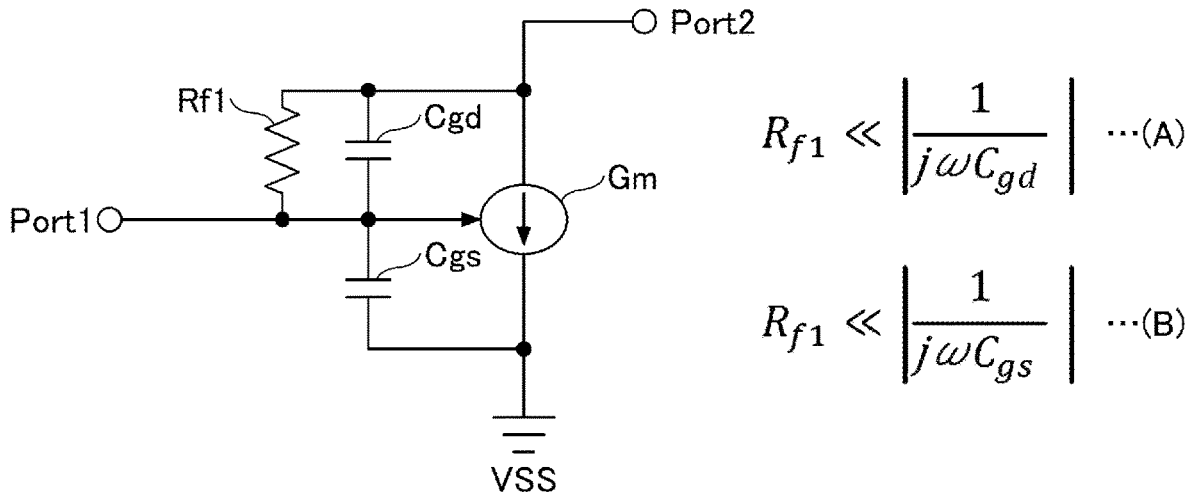
FIG. 10 is a diagram (1) illustrating an equivalent circuit of an FET amplifier to which the resistance element is added.

FIG. 10 is a diagram illustrating an equivalent circuit of FET amplifier 900 to which a resistance element is added. The equivalent circuit of FET amplifier 900 illustrated in FIG. 9 can be represented by parasitic capacitance Cgd between the gate terminal and the drain terminal of transistor Tr1, parasitic capacitance Cgs between the gate terminal and the source terminal of transistor Tr1, a current source having transconductance Gm, and a resistance element Rf1, as illustrated in FIG. 10. Further, by adding resistance element Rf1, in the low-frequency region in which the Equations (A) and (B) of FIG. 10 are satisfied, the values of impedances of parasitic capacitances Cgd and Cgs of transistor Tr1 are relatively higher than the value of resistance element Rf1 and thus can be ignored. In this case, an equivalent circuit of FET amplifier 900 is as illustrated in FIG. 11.

Figure 11:
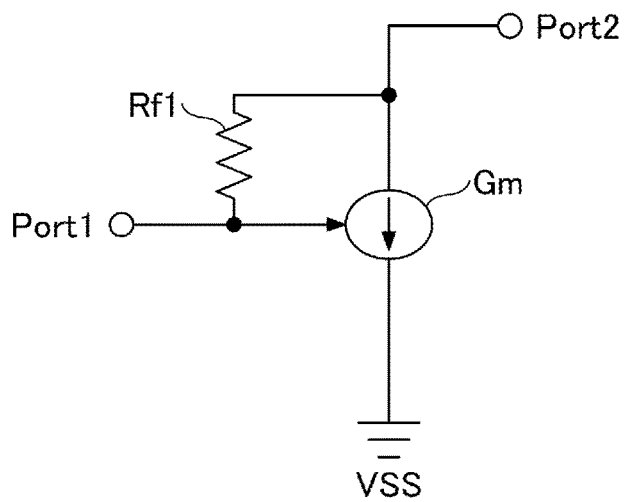
FIG. 11 is a diagram (2) illustrating an equivalent circuit of the FET amplifier to which the resistance element is added.

FIG. 11 is a diagram illustrating the equivalent circuit of the FET amplifier 900 to which a resistance element is added in a low-frequency region. This figure indicates an equivalent circuit of FET amplifier 900 in a low frequency region (for example, 1 GHz or less). In the equivalent circuit illustrated in FIG. 11, resistance element Rf1 constitutes negative feedback of FET amplifier 900. At this time, in FET amplifier 900, the impedance values of Cgs and Cgd in the low-frequency region are relatively negligible compared to the value of resistance element Rf1, so that the feedback from Port2 to Port1 does not become positive.

In FIG. 8, a broken line graph indicates frequency characteristics of the K value of FET amplifier 900 to which the resistance element is added, as illustrated in FIG. 9. As described above, in FET amplifier 900 to which the resistance element is added, the feedback from Port2 to Port1 does not become positive in the low-frequency region, so that there is no possibility of oscillation due to the gain of Gm, and the K value becomes a value around 1.0.

For example, when Cgs=100 fF, the right-hand side of Equation (b) of FIG. 10 becomes 3 kΩ in the case of a frequency of 1 GHz. Therefore, when the resistance value of resistance element Rf1 is sufficiently smaller than 3 kΩ, the FET amplifier 900 becomes completely stable in the low-frequency region. Even when it cannot be said that the resistance value of resistance element Rf1 is sufficiently smaller than 3 kΩ, the K value is higher than that in the case where there is no resistance element Rf1, and thus the stability of FET amplifier 900 is improved. As described above, the stability of FET amplifier 900 to which resistance element Rf1 is added is improved in the low-frequency region.

FET amplifier 900 to which resistance element Rf1 is added satisfies Rf1>>1/(jωCgd) in a frequency band (for example, 28 GHz or the like) for amplifying a radio-frequency signal, so that a characteristic change due to resistance element Rf1 is negligible.

<Simulation Results>

Next, simulation results of LNA circuit 120 according to the first embodiment will be described. Here, in LNA circuit 120 as illustrated in FIG. 5B, the gate length of transistor Q1 is approximately 150 nm, the gate width is 50 μm, and the resistance value of first resistance element R501 is 4.3 kΩ. In addition, simulation was performed by setting the gate length of second transistor Q2 to approximately 150 nm, the gate width to 30 μm, and the value of second resistance element R502 to 2Ω.

(NF Characteristic)

Figure 12:
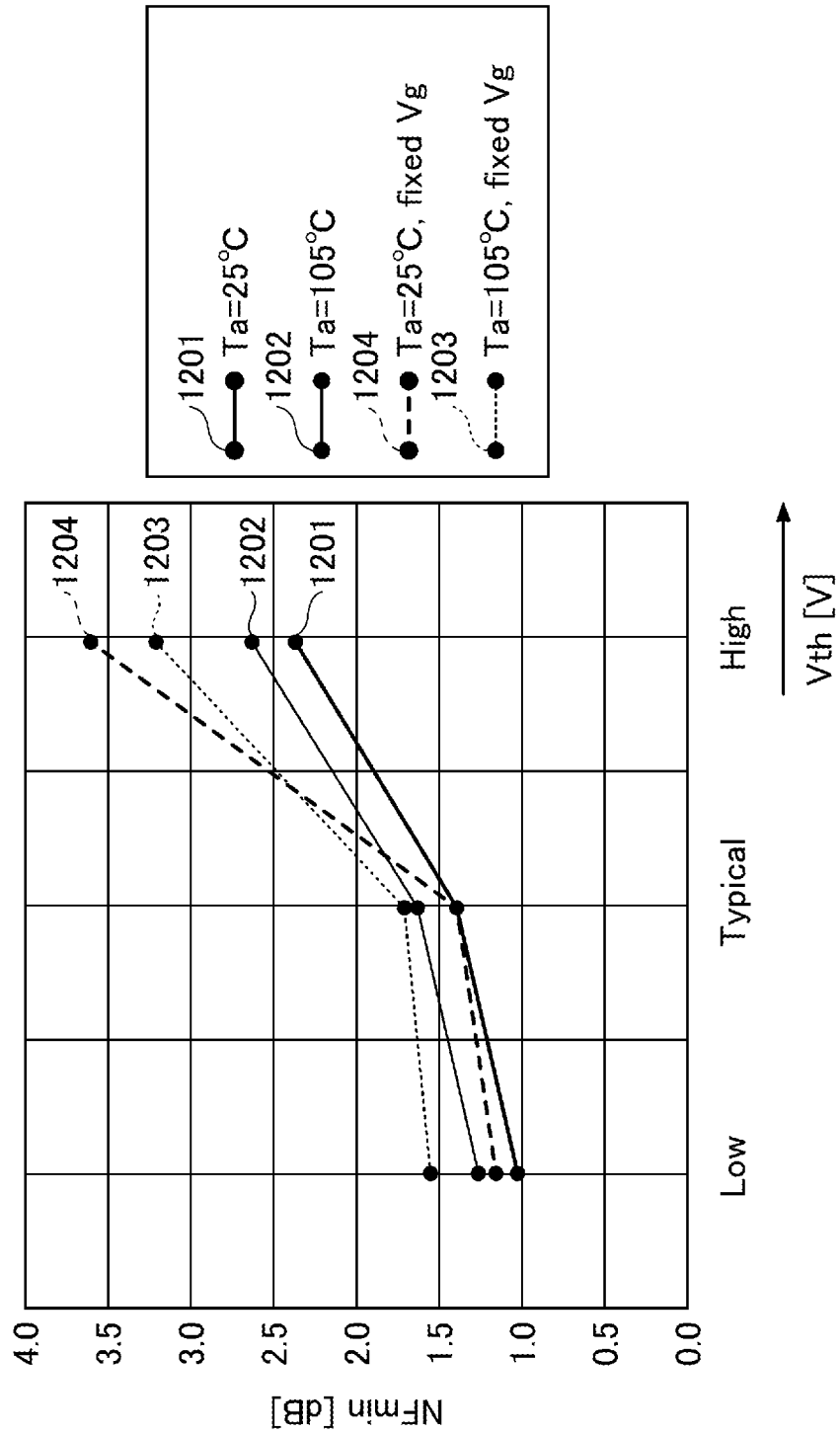
FIG. 12 is a graph illustrating an example of simulation results of an NF characteristic of the LNA circuit according to the first embodiment.

FIG. 12 indicates simulation results of the NF characteristic of the LNA circuit according to the first embodiment. In FIG. 12, the horizontal axis represents variations in threshold voltage Vth of the FET, that is, manufacturing variations, and the vertical axis represents the minimum value of the NF characteristic. A first solid line 1201 indicates a change in the minimum value of the NF characteristic corresponding to a change in threshold voltage Vth at Ta=25° C. of LNA circuit 120 according to the first embodiment. A second solid line 1202 indicates a change in the minimum value of the NF characteristic corresponding to a change in threshold voltage Vth at Ta=105° C. of LNA circuit 120 according to the first embodiment. A third dotted line 1203 indicates a change in the minimum value of the NF characteristic corresponding to a change in threshold voltage Vth at Ta=25° C. in a case where the LNA circuit is configured as the FET amplifier to which no resistance element is added as illustrated in FIG. 6 and a fixed voltage Vg is applied, for example. A fourth dotted line 1204 indicates a change in the minimum value of the NF characteristic corresponding to a change in threshold voltage Vth at Ta=105° C. when the LNA circuit is configured as the FET amplifier to which no resistance element is added as illustrated in FIG. 6 and fixed voltage Vg is applied, for example.

As illustrated in FIG. 12, it can be found that in LNA circuit 120 according to the first embodiment, even when threshold voltage Vth fluctuates, a change in the minimum value of the NF characteristic is suppressed compared to an LNA circuit to which fixed voltage Vg is applied. It can also be seen that LNA circuit 120 according to the first embodiment suppresses a change in the minimum value of the NF characteristic even when the temperature changes, compared to the LNA circuit to which fixed voltage Vg is applied.

(K Value)

Figure 13:
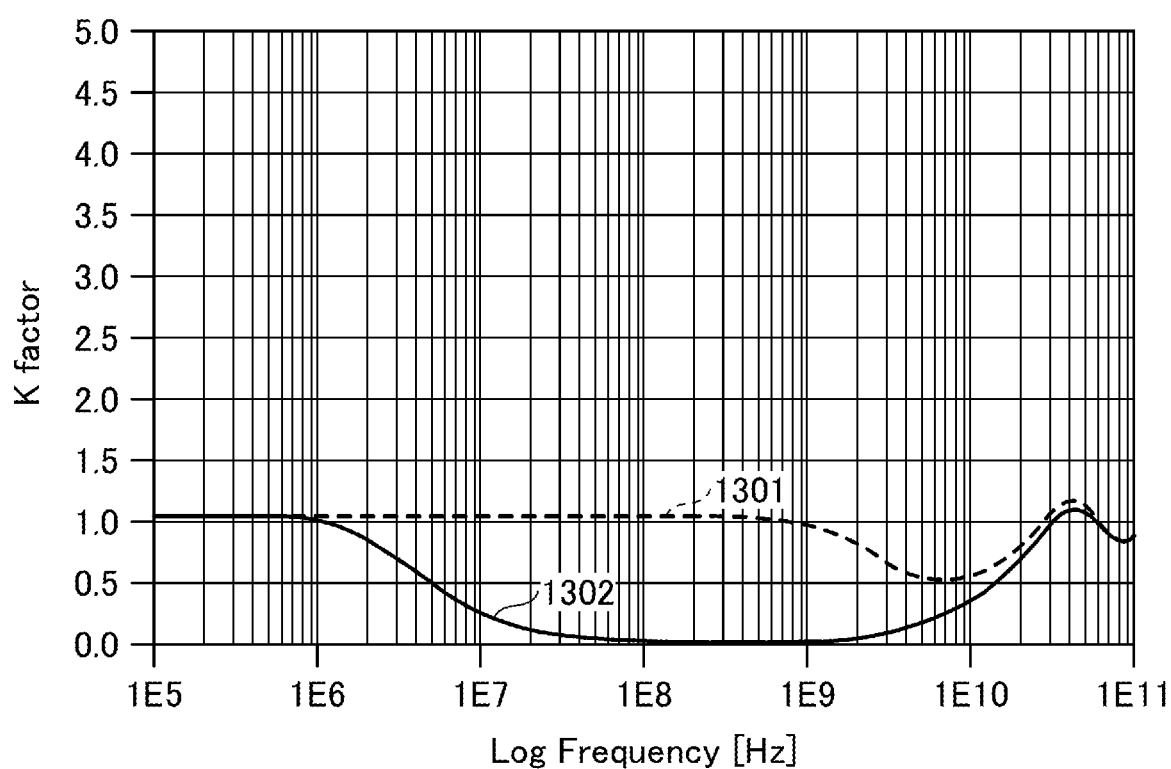
FIG. 13 is a graph illustrating an example of simulation results of a K value of the LNA circuit according to the first embodiment.

FIG. 13 is a graph indicating simulation results of the K value of the LNA circuit according to the first embodiment. Here, the frequency characteristic of the K value was simulated under a severe condition of Ta=−40° C. where the circuit operation becomes most unstable. In FIG. 13, the horizontal axis represents the frequency, and the vertical axis represents the K value. A first line 1301 indicates the frequency characteristic of the K value at Ta=−40° C. of LNA circuit 120 according to the first embodiment. A second line 1302 indicates the frequency characteristic of the K value at Ta=−40° C. when the LNA circuit is configured as the ELT amplifier to which no resistance element is added as illustrated in FIG. 6 and fixed voltage Vg is applied, for example.

In view of second line 1302, it is apparent that the K value of the LNA circuit to which fixed voltage Vg is applied is less than 0.5 in the range of frequencies 10 MHz to 1 GHz and the LNA circuit is unstable. In first line 1301, LNA circuit 120 according to the first embodiment maintains the K value to be a value exceeding 1.0 in the low-frequency region of 1 GHz or less. In LNA circuit 120 according to the first embodiment, the K value is 0.5 or greater at all frequencies illustrated in FIG. 13.

Second Embodiment

Figure 14:
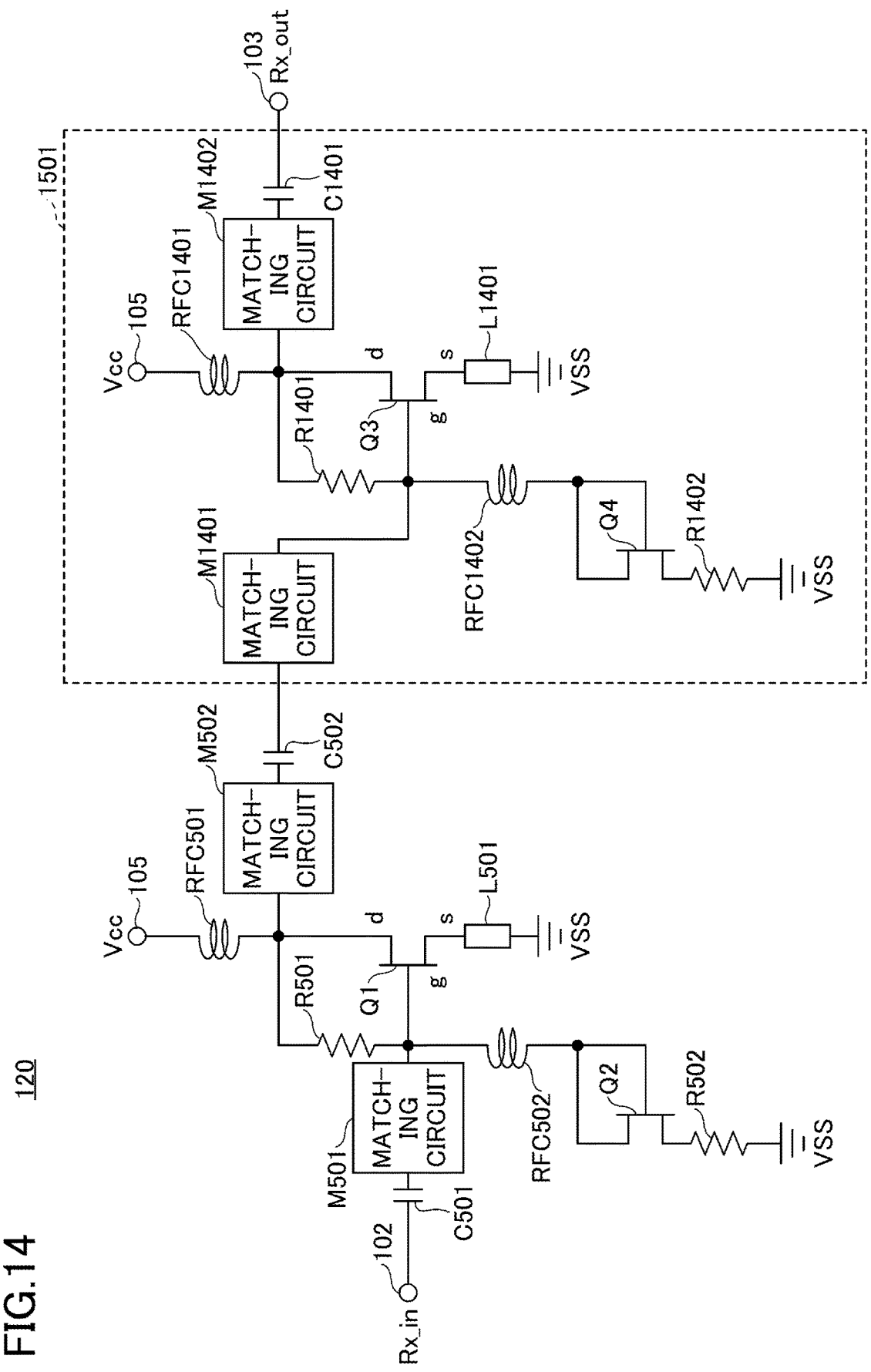
FIG. 14 is a diagram illustrating an example of a circuit configuration of the LNA circuit according to the second embodiment.

In the first embodiment, an example in which LNA circuit 120 included in semiconductor device 100 is configured by a single-stage FET amplifier has been described, but LNA circuit 120 may be configured by a two-stage FET amplifier as illustrated in FIG. 14, for example.

FIG. 14 is a diagram illustrating an example of a circuit configuration of an LNA circuit according to a second embodiment. In the example of FIG. 14, a second stage FET amplifier is added to a subsequent stage of LNA circuit 120 according to the first embodiment described with reference to FIG. 5B. Accordingly, the drain of first transistor Q1 is connected to the output terminal such as Rx_out terminal 103 or the like via matching circuit M502, capacitance element C502, and a second FET amplifier 1501.

Second FET amplifier 1501 may be, for example, the same as LNA circuit 20 according to the first embodiment illustrated in FIG. 5B. In the example illustrated in FIG. 14, second FET amplifier 1501 includes a third transistor Q3 and a fourth transistor Q4 constituting a current mirror circuit with third transistor Q3. Similarly to LNA circuit 20 according to the first embodiment, second FET amplifier 1501 includes resistance elements R1401 and R1402, an inductor element L1401, a choke coil RFC1401 and RFC1402 for high frequency, a capacitance element C1401, and the like.

However, the configuration of LNA circuit 120 according to the second embodiment illustrated in FIG. 14 is an example. For example, a matching circuit M1401 may be integrated with matching circuit M502 into a single matching circuit. Because the NF characteristic of the first stage LNA circuit is dominant in the NF characteristic of the receiving circuit, another type of FET amplifier that does not require an external terminal may be used as second FET amplifier 1501.

Semiconductor device 100 according to the present disclosure illustrated in FIG. 1 includes, for example, LNA circuit 120 according to the first embodiment as illustrated in FIG. 5A and FIG. 5B or LNA circuit 120 according to the second embodiment as illustrated in FIG. 14. Therefore, according to each embodiment of the present disclosure, in semiconductor device 100 including an amplifier circuit that amplifies a radio-frequency signal, stable characteristics can be obtained without using an external terminal. The semiconductor device according to the present disclosure is not limited to the configuration of semiconductor device 100 illustrated in FIG. 1, and may be a semiconductor device having various configurations including, for example, LNA circuit 120 according to the first embodiment as illustrated in FIG. 5A and FIG. 5B, or LNA circuit 120 according to the second embodiment as illustrated in FIG. 14.

Although the embodiments of the present disclosure have been described above, the present disclosure is not limited to the above-described embodiments and the like. Various changes, modifications, substitutions, additions, deletions, and combinations are possible within the scope of the claims. These also naturally belong to the technical scope of the present disclosure.

What is claimed is:

1. A semiconductor device comprising:
an input terminal to which a radio-frequency signal is to be input;
an output terminal from which a signal obtained by amplifying the radio-frequency signal is to be output;
a first power supply terminal;
a first transistor having a gate terminal, a source terminal, and a drain terminal;
a second transistor having a gate terminal, a source terminal, and a drain terminal;
a second power supply terminal; and
a first resistance element,
a first coil; and
a second coil, wherein
the gate terminal of the first transistor is connected to the input terminal,
the source terminal of the first transistor is connected to the first power supply terminal,
the drain terminal of the first transistor is connected to the second power supply terminal via the first coil,
the drain terminal of the first transistor is further connected to the output terminal,
the gate terminal of the first transistor and the drain terminal of the first transistor are connected to each other via the first resistance element,
the source terminal of the second transistor is connected to the first power supply terminal,
the gate terminal of the second transistor and the drain terminal of the second transistor are short-circuited at a first node, the first node being connected to the gate terminal of the first transistor via the second coil, and
in a low-frequency region lower than a frequency band of the radio-frequency signal,
an impedance of the first resistance element is lower than an impedance of a parasitic capacitance between the gate terminal of the first transistor and the drain terminal of the first transistor, and is lower than an impedance of a parasitic capacitance between the gate terminal of the first transistor and the source terminal of the first transistor.

2. The semiconductor device according to claim 1, wherein in the frequency band of the radio-frequency signal, the impedance of the first resistance element is higher than the impedance of the parasitic capacitance between the gate terminal of the first transistor and the drain terminal of the first transistor.

3. The semiconductor device according to claim 1, further comprising a second resistance element connected between the source terminal of the second transistor and the first power supply terminal.

4. The semiconductor device according to claim 1, wherein the first transistor and the second transistor are formed on a semiconductor substrate.

* * * * *